(12) United States Patent
Zhou

(10) Patent No.: US 8,959,291 B2
(45) Date of Patent: Feb. 17, 2015

(54) TWO-PORT MEMORY CAPABLE OF SIMULTANEOUS READ AND WRITE

(75) Inventor: Ting Zhou, Darnby, CT (US)

(73) Assignee: LSI Corporation, San Jose, CA (US)

( * ) Notice: Subject to any disclaimer, the term of this patent is extended or adjusted under 35 U.S.C. 154(b) by 780 days.

(21) Appl. No.: 12/974,943

(22) Filed: Dec. 21, 2010

(65) Prior Publication Data

US 2011/0302376 A1     Dec. 8, 2011

Related U.S. Application Data

(60) Provisional application No. 61/351,336, filed on Jun. 4, 2010.

(51) Int. Cl.
| | | |
|---|---|---|
| *G06F 12/08* | (2006.01) |
| *G11C 8/16* | (2006.01) |
| *G06F 12/06* | (2006.01) |
| *G11C 7/10* | (2006.01) |

(52) U.S. Cl.
CPC .... *G11C 8/16* (2013.01); *G06F 12/06* (2013.01); *G11C 7/1075* (2013.01)
USPC .................................. 711/149; 711/E12.048

(58) Field of Classification Search
CPC .................................................. G06F 12/0853
See application file for complete search history.

(56) References Cited

U.S. PATENT DOCUMENTS

| | | | |
|---|---|---|---|
| 5,177,706 A | 1/1993 | Shinohara et al. |
| 6,771,556 B2 | 8/2004 | Aden |
| 6,886,088 B2 | 4/2005 | Andreev et al. |
| 7,333,381 B2 | 2/2008 | Rosen |
| 7,461,191 B2 | 12/2008 | Baer et al. |
| 7,533,222 B2 | 5/2009 | Leung |
| 8,248,869 B1 * | 8/2012 | Chan et al. ................... 365/191 |
| 2006/0123136 A1 * | 6/2006 | Oku et al. .................... 709/250 |
| 2007/0183241 A1 | 8/2007 | Batra |
| 2010/0161892 A1 * | 6/2010 | Dama et al. .................. 711/104 |

\* cited by examiner

*Primary Examiner* — Charles Rones
*Assistant Examiner* — Ryan Dare

(57) ABSTRACT

Described embodiments provide a multi-port memory system that has a plurality of memory banks and an equal number of mapping memory banks, each one of the data memory banks corresponding to one of the mapping memory banks. The multi-port memory reads, from one of the mapping memory banks selected by a read logical bank number, a read physical bank number identifying which one of the data memory banks data is to be read. The memory system also calculates, from at least one physical bank number read from the mapping memory banks other than the mapping memory bank selected by the read logical bank number, a write physical bank number indicating which one of the data memory banks is to be written. The calculation uses a hash of the physical bank numbers, such as by using an Exclusive-OR. This arrangement allows for simultaneous read/write access of the memory with fixed latency.

15 Claims, 3 Drawing Sheets

300

TWO-PORT MEMORY CAPABLE OF SIMULTANEOUS READ AND WRITE

CROSS-REFERENCE TO RELATED APPLICATIONS

This application claims the benefit of the filing date of U.S. provisional application no. 61/351,336 filed 4 Jun. 2010 the teachings of which are incorporated herein in their entireties by reference.

BACKGROUND OF THE INVENTION

1. Field of the Invention

The present invention relates to multi-port memories generally and, more specifically, to emulated two-port memories using conventional single-port memories.

2. Description of the Related Art

Multi-port memories are widely used to allow substantially simultaneous access of the memory via two or more ports. For example, in data communication applications, packets for transmission or being received may be stored in a buffer, such as a FIFO buffer, prior to transmission or processing. Other applications include data scramblers and video graphics processors. Multi-port memories are generally characterized by the ability to write data to the memory on one port while simultaneously reading data on another port. One embodiment of a multi-port memory is a two-port memory, configured to allow read access on one dedicated port and write access on the other port, known generally as a single port read, single port write (1R1W) memory. Because implementing a true two-port memory can consume a large amount of area on a chip, many two-port memories, particularly those having more than a few tens of thousands of memory locations, are emulations utilizing banks of conventional single-port memories, known generally as single port Read/Write (1RW) memories. An emulated two-port memory might suffer from undesired latency should a simultaneous access of the same 1RW memory bank by both ports occur, such that repeated access of the same 1RW memory bank might result in a significant reduction in the rate the memory can be accessed by either port. Generally, the latency penalty for simultaneous access is one or more access or clock cycles. However, the amount of latency is dependant on memory access patterns and is not a fixed amount. More problematic is a simultaneous read and write to the same 1RW memory bank where the data being read is also overwritten, adding a data coherency issue on top of the latency and memory access rate problems.

One solution to the above problems is to "double pump" or access the 1RW memory bank twice in one clock cycle, e.g., doing the write in the first half of the cycle, then doing the read. However, this technique effectively requires that the memories run at twice the clock rate, limiting the speed of the two-port memory.

Thus, it is desirable to provide a two-port design that allows for simultaneous read and write with a low or fixed latency.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a multi-port memory system, comprising a plurality of data memory banks and an equal number of mapping memory banks, each one of the data memory banks corresponding to one of the mapping memory banks. A method of accessing and storing data in the plurality of data memory banks comprises: reading, from one of the mapping memory banks selected by a read logical bank number, a read physical bank number identifying which one of the data memory banks data is to be read; reading at least one physical bank number from the mapping memory banks other than the mapping memory bank selected by the read logical bank number; and calculating, from the at least one physical bank number, a write physical bank number indicating which one of the data memory banks data is to be written.

In an alternative embodiment, a multi-port memory system has a plurality of data memory banks and an equal number of mapping memory banks, each one of the data memory banks corresponding to one of the mapping memory banks. The multi-port memory system is adapted to read, from one of the mapping memory banks selected by a read logical bank number, a read physical bank number identifying which one of the data memory banks data is to be read. The system is further adapted to read at least one physical bank number from the mapping memory banks other than the mapping memory bank selected by the read logical bank number, and calculate a write physical bank number from the at least one physical bank number, to thereby determine which one of the data memory banks data is to be written.

In one specific implementation of the multi-port memory, one port is used solely for writing and the other port used solely for reading (1R1W). It is understood that each of the data memory banks and each of the mapping memory banks can comprise one or more memories therein and, therefore, such embodiments are within the scope of the claimed invention.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

In accordance with embodiments of the present invention, a multi-port memory system has a plurality of data memory banks and an equal number of mapping memory banks, each one of the memory banks corresponding to one of the mapping memory banks. The multi-port memory system is adapted to read, from one of the mapping memory banks selected by a read logical bank number, a read physical bank number identifying which one of the data memory banks data is to be read. The system is further adapted to calculate, from at least one physical bank number read from the mapping memory banks other than the mapping memory bank selected by the read logical bank number, a write physical bank number indicating which one of the data memory banks data is to be written.

Table 1 defines a list of acronyms employed throughout this specification as an aid to understanding the described embodiments of the present invention:

TABLE 1

| | |
|---|---|
| ARL | Read Logical Address |
| AWL | Write Logical Address |
| BRL | Read Logical Bank number |
| BWL | Write Logical Bank number |
| BRP | Read Physical Bank number |
| BWP | Write Physical Bank number |
| BSP | Spare Physical Bank number |
| ORL | Read address offset |
| OWL | Write address offset |
| AW | Mapping memory address for initialization |
| BN | Mapping memory bank number for initialization |
| FIFO | First-In-First-Out Memory |
| I/O | Input/Output |
| MUX | Multiplexer |
| UNDEF | Undefined variable |
| EXOR | Exclusive OR |
| 1RW | Single-port read/write memory |
| 1R1W | Two-port memory, one write port, one read port |
| 2R1W | Three-port memory, two read ports, one write port |
| 1R2W | Three-port memory, one read port, two write ports |

Figure 1:
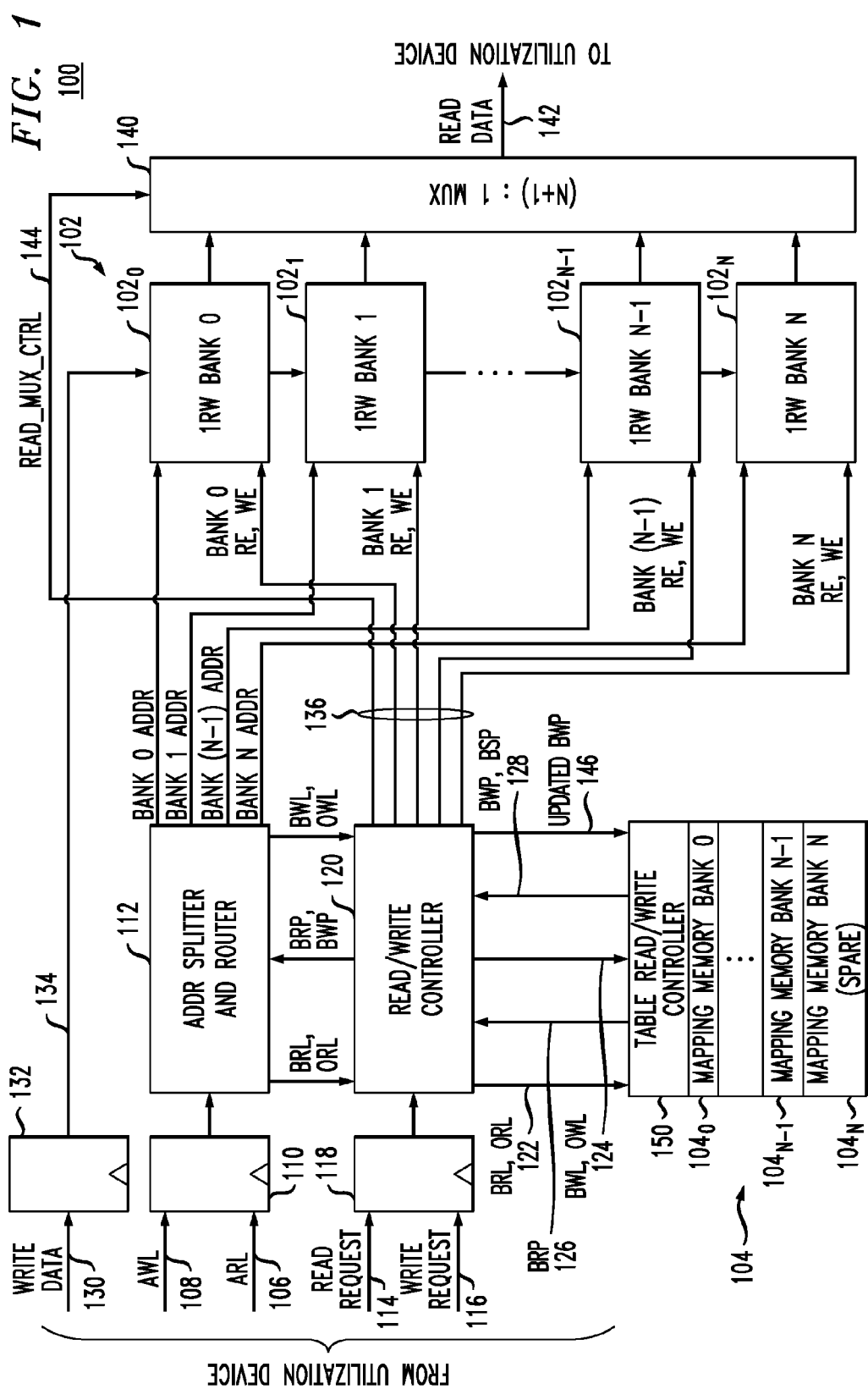
FIG. 1 shows a block diagram of a two-port 1R1W memory in accordance with exemplary embodiments of the invention.

In FIG. 1, a block diagram of an exemplary two-port memory 100 according to embodiments of the invention is illustrated. It is understood that this exemplary embodiment operates fully synchronously, i.e., in response to an applied clock signal (not shown), and can be implemented, at least partially, asynchronously. The memory 100 is generally part of a larger system, such as a packet processor or video graphics system that typically includes a microprocessor or the like, but can be implemented as a stand-alone subsystem.

The 1R1W memory 100 comprises a data memory 102 and a mapping memory 104. As will be discussed in more detail below, the data memory 102 comprises multiple banks $102_0$-$102_N$ of conventional single-port 1RW memories, and the mapping memory 104 comprises multiple two-port 1R1W mapping memory banks $104_0$-$104_N$, where N is a positive integer greater than one. For purposes here and in this embodiment, there are as many mapping memory banks $104_0$-$104_N$ as there are data memory banks $102_0$-$102_N$. Each mapping memory banks $104_0$-$104_N$ contains one or more two-port 1R1W memories. An exemplary 1R1W memory suitable for use as a 1R1W mapping memory bank $104_0$-$104_N$ is shown in U.S. Pat. No. 5,177,706, incorporated by reference herein in its entirety. Each of the data memory banks $102_0$-$102_N$ has one or more single-port (1RW) memories (not shown).

Read logical address ARL and write logical address AWL for the memory 100 are asserted over buses 106, 108, respectively, to a clocked latch 110 for presentation to Address Splitter and Router 112 from a utilization device, such as a packet processor (not shown). The read and write addresses are of the form [Logical Bank Number].[Offset Address], where "." indicates a concatenation of the logical bank number and the offset address. The logical bank number is BRL and BWL for read and write, respectively. BRL and BWL are integers ranging from zero to N-1. The offset address is ORL and OWL for reads and writes, respectively. In this embodiment, the offset address is used for both the logical and physical addressing of the memories 102, 104. In addition, the logical bank number and the offset address may be combined in any conventional way that preserves uniqueness in addressing the memory 100, i.e., there is a one-for-one correspondence between the addresses on buses 108, 110 and data stored in the data memory 102.

The address splitter 112 routs or directs the offset addresses ORL, OWL to a selected data memory bank $102_0$-$102_N$ depending on whether a read or write is occurring in the pertinent data memory bank. As will be explained in more detail below, the actual data memory bank $102_0$-$102_N$ in which a read or write occurs is determined by a physical bank number read from the mapping memory 104. Simply put, the mapping memory 104 takes the logical bank number and translates it into a physical bank number, which the address splitter 112 uses to direct the appropriate read or write address offset.

In addition to the read and write addresses, corresponding read and write requests are asserted over buses 114, 116, respectively, to a clocked latch 118 for presentation to Read/Write Controller 120, implemented as a state machine. The enable signals initiate a read operation, a write operation, or both, by the controller 120. The controller 120 passes the read and write logical bank numbers, BRL, BWL to mapping memory 104 via buses 122, 124, respectively, and retrieves from the mapping memory 104 the read and write physical bank numbers, BRP, BWP, via buses 126, 128, respectively, used to select the data memory bank $102_0$-$102_N$ for reading or writing of data. The controller also provides two updated write physical bank numbers to the mapping memory 104 when a read and write conflict occurs, as will be explained in more detail in connection with FIG. 2.

In addition to the above, the controller 120 performs an initialization of the mapping memory 104 when required, such as after being powered up. As will be discussed in more detail in connection with FIG. 3, the various mapping memory banks $104_0$-$104_N$ is initialized with a logical-to-physical bank number mapping. In an embodiment, the initialization sets all of the memory locations in each mapping memory bank equal to the bank number of that bank, e.g., for mapping memory bank $104_0$, all the locations are set to zero, for mapping memory bank $104_N$, all the locations therein are set to N, etc. By having a unique physical bank mapping number in each of the mapping memory banks for a given offset, an algorithmic "hash" of those values is a "constant" that can be used to reconstruct an entry in any one of the mapping memory banks from the other mapping memory banks. Exemplary hash algorithms suitable for this purpose are a bit-wise Exclusive-OR (EXOR) or a truncated summation, but it is understood that other algorithms can be used.

In one embodiment, the bit-wise EXOR is used as the hash algorithm, and is used to calculate a constant C by combining ("EXORing") all of the values of the bank numbers together. For example, if N=7 (binary "111"), then C=0; if N=16 (binary "1000"), then C=16; but if N=17 (binary "1001"), then C=1. If summation is used, it is preferably truncated modulo two raised to the power of the number of bits in BRP and BWP.

Advantageously, since N is generally known before the memory 100 is designed, it is possible to precomputed the constant C.

Both the mapping memory 104 and data memory 102 each contain an additional memory bank, e.g., $102_N$ and $104_N$. These extra banks serve to allow substantially simultaneous read and write operations to the same logical data memory bank $102_0$-$102_{N-1}$. As will be explained in more detail in connection with FIG. 2, having N+1 data memory banks, e.g., bank $102_N$, allows for data being written when a write request and a read request simultaneously request access to the same data memory bank, e.g., $102_0$. By using a hash algorithm of the entries in the mapping memory banks $104_0$-$104_N$, reconstitution of mapping memory data of any of the mapping memory banks $104_0$-$104_N$ is possible when one of the mapping memory banks is unavailable or is being accessed for other purposes.

Unlike the logical bank numbers BRL, BWL, the physical bank numbers BRP, BWP will range from zero to N because of the use of N+1 data memory banks and N+1 mapping memory banks. In embodiments herein, a data memory bank selected using the BRP or BWP is referred to herein as $102_{BRP}$ or $102_{BWP}$, respectively. For the mapping memory 104, a mapping memory bank is selected using the logical bank numbers, BRL, BWL and is referred to herein as $104_{BRL}$ or $104_{BWL}$, respectively. Since, as discussed above, the logical bank numbers range from zero to N-1, the mapping memory bank $104_N$ is used store BSP, which indicates which bank of the data memory 102 will be used for write during simultaneous reads and writes to the same data memory bank.

During a write, data to be written is transmitted over write data bus 130, latched by clocked latch 132, and provided to each of the data memory banks $102_0$-$102_N$ via bus 134. The memory bank being written to loads data on bus 134 in response to a corresponding one of the write enable (WE) signals 136 from controller 120.

During a read and in response to a corresponding one of the read enable (RE) signals 136 from controller 120, a selected one of the data memory banks $102_0$-$102_N$ provides data to a multiplexer 140 for presentation on read data output bus 142. Multiplexer control signals on bus 144, from controller 120, configure the multiplexer 140 to couple the selected data memory bank to the output bus 142. It is understood that the multiplexer 150 can be eliminated by using conventional bus multiplexing techniques where outputs of all of the data memory banks are connected in parallel and all of the banks, except the selected data memory bank, have a high output impedance.

Each of the data memory banks $102_0$-$102_N$ has a depth d and are preferably as wide as the write data bus 130 and read data output bus 142. Generally, d is equal to a power of two, e.g., $2^{16}$, $2^{20}$, etc., such that the ORL and OWL address each have the same number of bits as the above-described exponent, e.g., 16 bits for $2^{16}$ locations, 20 bits for $2^{20}$ locations, etc., but may be other values, e.g., 6500 locations. Each of the mapping memory banks $104_0$-$104_N$ also has a depth of d but has a width of $\log_2(N+1)$ bits, excluding optional error protection codes (not shown), rounded up to the next larger integer, e.g., if N=16, then the width of the each mapping memory bank $104_0$-$104_N$ is five bits ($\log_2(16+1)$ is approximately 4.09).

The mapping memory 104 includes a Table Read/Write controller 150 that interfaces between the Read/Write controller 120 and the mapping memory banks $104_0$-$104_N$. As will be discussed in more detail below, the controller 150 is a state machine that directs logic to read BRP and BWP from the mapping memory banks $104_0$-$104_N$ according to the BRL and BWL it receives. In the case where BRL and BWL are equal, controller 150 reconstructs data stored in the memory mapping banks using a hash algorithm, as described above. This feature allows for two simultaneous reads to the same logical bank number with 1R1W memories instead of 2R1W (two read ports, one write port) memories for the mapping memory banks $104_0$-$104_N$ with low, fixed latency, with data coherency in a smaller area than traditional single 2R1W memory or by duplicated 1R1W memories configured to implement a 2R1W memory.

In an alternative embodiment, using data memory banks $102_0$-$102_N$ with additional read or write ports may allow for an increase the number of corresponding ports of memory 100. In one embodiment, for each additional read port added to each of the memory banks $102_0$-$102_N$, the number of read ports of memory 100 may be increased by one. In another embodiment, for each additional write port added to each of the memory banks $102_0$-$102_N$, the number of write ports of memory 100 may be increased by one. For example, using 1R1W memories for the data memory banks $102_0$-$102_N$ instead of 1RW memories, then the memory 100 may provide 1R2W capability. Similarly, by using 2R1W memories, the memory 100 may provide 2R2W functionality, etc.

Exemplary Operation of the 1R1W Memory 100

Figure 2:
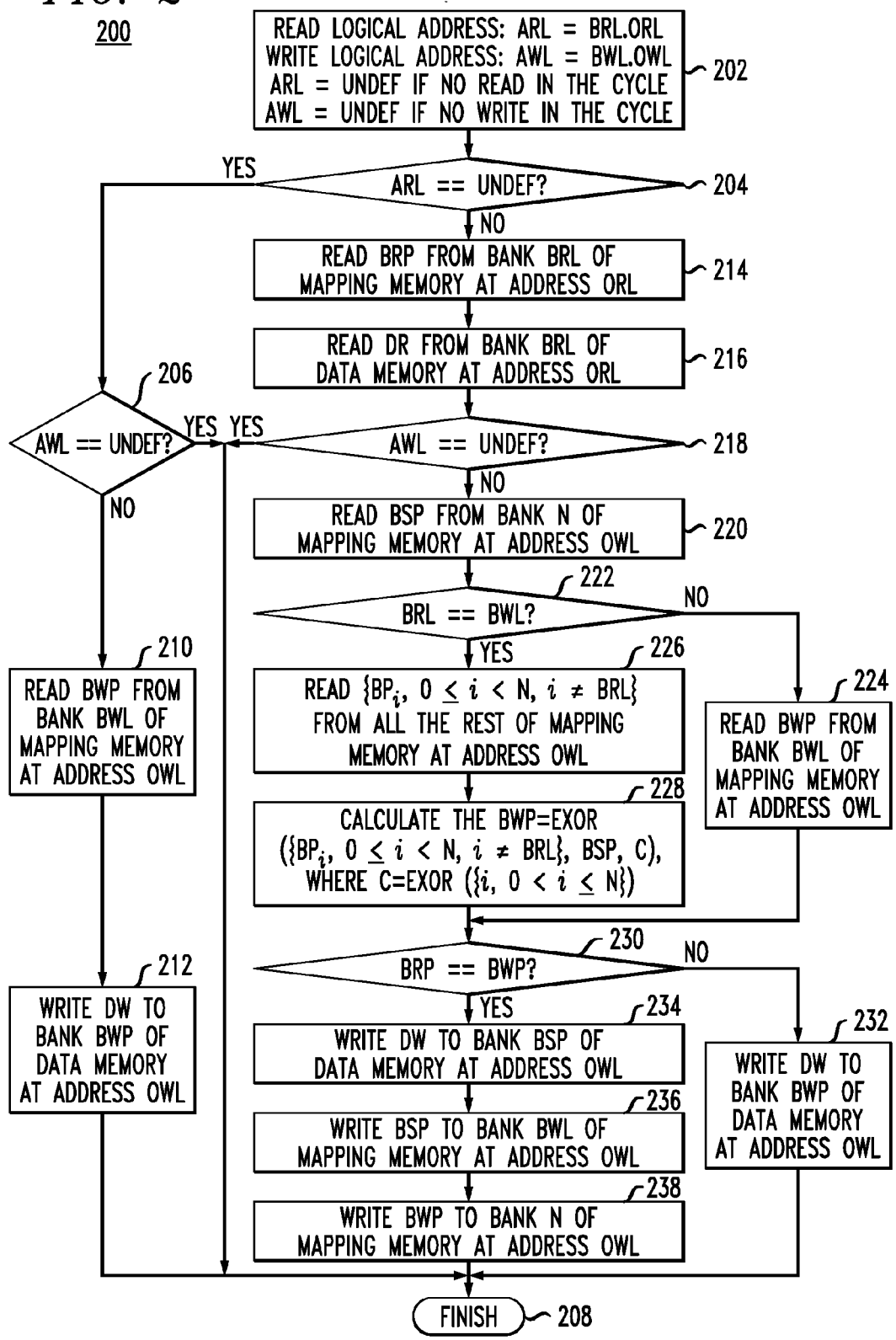
FIG. 2 is a simplified flowchart illustrating exemplary read and write operations of the two-port memory of FIG. 1.

FIG. 2 is a simplified flowchart 200 illustrating exemplary read and write operations of the two-port memory 100 of FIG. 1. It is understood that while the flowchart indicates that the various steps are performed sequentially, many of the steps occur concurrently within the same clock cycle.

In step 202, when a read or a write request is received over buses 114, 116, the respective addresses ARL and AWL have a value. Otherwise, for purposes here, they are "undefined" (UNDEF). In step 204, if the Read/Write Controller 120 (FIG. 1) if the read address ARL is undefined (no read request is received), then in step 206 the Read/Write Controller 120 determines if the write address AWL is undefined, then no read or write cycle is to occur and the memory 100 waits, at step 208, for another cycle to check for read and write requests. If, however, the AWL is not undefined, then in step 210 BWP is read from the mapping memory bank $104_{BWL}$ at address OWL. Then, in step 212, write data on bus 130 is written to data memory bank $102_{BWP}$ at address OWL, and control passes to step 208 to await the next cycle in step 202.

Returning to step 204, if the read address is not undefined, then in step 214 the BRP is read from mapping memory bank $104_{BRL}$ at address ORL. Then, under control of Controller 120, data is read from data memory bank $102_{BRP}$ at address ORL and, via multiplexer 140 (FIG. 1) onto output bus 142 and control passes to step 218.

In step 218, the controller 120 checks to see if AWL is undefined and, if so, control passes to step 208. However, if AWL is not undefined, then simultaneous read and write requests are pending (i.e., a read request and a write request in received in the same clock cycle by controller 120). In step 220, a spare physical bank number (BSP) is read from mapping memory bank $104_N$ at address OWL.

Next, in step 222, controller 120 checks to see if BRL equals BWL. If they are not equal, different logical banks are being read and written in the same cycle and, in step 224, the BWP is read from mapping memory bank $104_{BWL}$ at address OWL. However, if BRL equals BWL in step 222, then the same mapping memory bank, $104_{BRL}$ or $104_{BWL}$, must be accessed to obtain the BRP and BWP, respectively. Since, in step 214 the mapping memory bank $104_{BRL}$ is being accessed to obtain BRP, BWP is obtained without accessing the same mapping memory bank since, if ORL and OWL are different, then two separate cycles are needed to obtain BRP and BWP or a true 2R1W memory is needed for each of the mapping memory banks $104_0$-$104_N$. Using two different access cycles may be too costly in time, whereas using 2R1W memories too expensive to implement, for a practical 1R1W memory 100. Instead, in step 226, the Table Read/Write Controller 150 reads physical bank numbers, BPi, 0≤i<N (i is an integer), all the mapping memories banks $104_0$-$104_{N-1}$, except bank $104_{BRL}$ (i≠BRL), at address OWL. All the data read in step 226 (N sets of data) are hashed together, in step 228, with the BSP and the constant C, discussed above, to derive BWP.

Once BWP is obtained from either step 224 or 226/228, then controller 120 determines, in step 230, if the same data memory bank is to accessed for both the read and write requests (BRP=BWP). If different data memory banks are to be accessed (BRP≠BWP), then, in step 232, write data on bus 130 is written to data memory bank $102_{BWP}$ at address OWL, and control passes to step 208, as discussed above. If, however, BRP=BWP, in step 234 write data on bus 130 is written to data memory bank $102_{BSP}$ at address OWL, BSP is written to mapping memory bank $104_{BWL}$ at address OWL over bus 146 (FIG. 1) in step 236. Then, in step 238, BWP is written to the spare mapping memory bank $104_N$ at address OWL and control passes to step 208, as discussed above. Alternatively, instead of checking if BRP=BWP in step 230, steps 230 and 232 do not exist and steps 234-238 are always executed. This has the advantage of improving timing between mapping memory output to writing data into the data memory bank. However, when the mapping memory updates in steps 236, 238 happen for write to the data memory, a little more power is consumed by the memory 100.

Exemplary Initialization of the Mapping Memory 104 in 1R1W Memory 100

Figure 3:
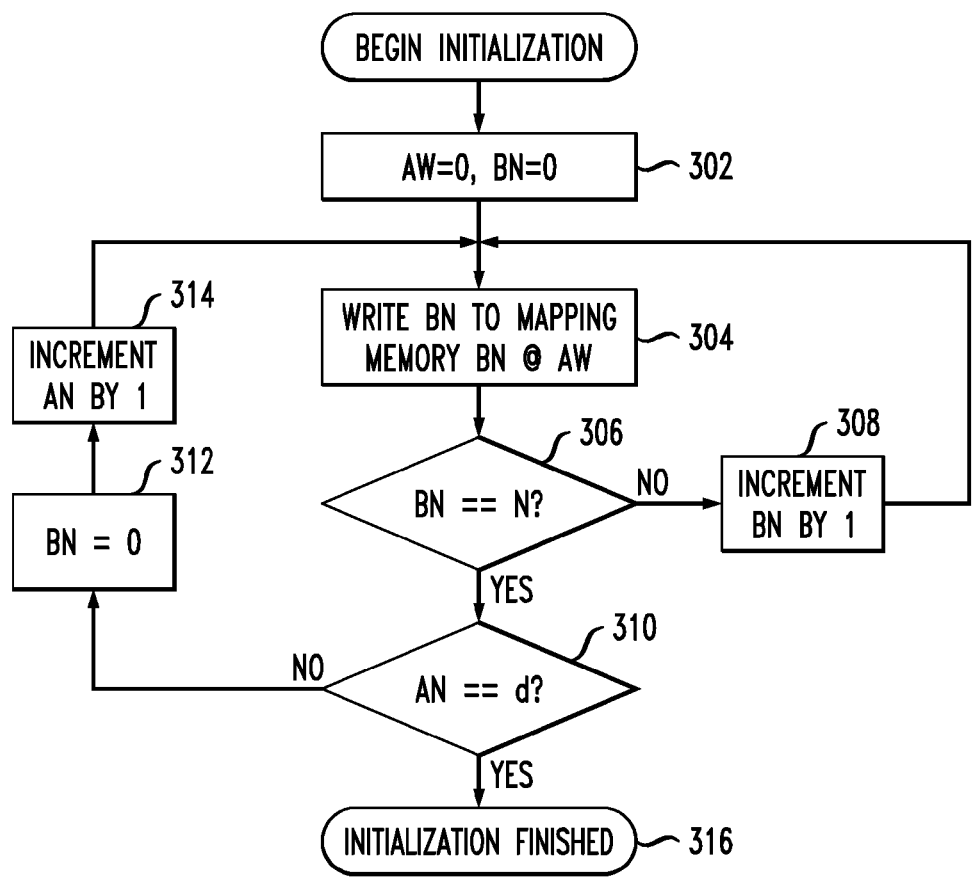
FIG. 3 is a simplified flowchart of an exemplary initialization operation for the two-port memory of FIG. 1.

FIG. 3 is a simplified flowchart of an exemplary initialization operation for the mapping memories in FIG. 1. Initialization of the mapping memory 104 is needed to have all the locations with a unique physical bank number for the hashing technique to work. In this embodiment, the initialization 300 begins with step 302 where address AW and bank number BN is set to zero. Then, in step 304, the bank number BN is written to mapping memory bank $104_{BN}$ at address AN. At step 306, the bank number BN is checked against maximum (N) and, if it is less than N, BN is incremented in step 308 and control returns to step 304. Once all the banks $104_0$-$104_N$ at address AN have been written in step 304, then, in step 310, the maximum address is checked to see if the last address of the memory (d) has been used, and if not, then BN is reset to zero in step 312, AN incremented in step 314, and control passes back to step 304. If, however, all of the locations in all of the mapping memory banks $104_0$-$104_N$ have been written to, the initialization is finished in step 316.

While the initialization 300 assigns the physical bank number in each of the mapping memory banks to be the same as the mapping memory bank number, other assignments can be done. For example, any assignment order can be used providing the physical bank numbers are used only once for each address AW. However, scrambling the order of the physical bank numbers may be beneficial in reducing power consumption depending on the application employing the 1R1W memory 100.

While the exemplary embodiments of the present invention have been described with respect to processing blocks in a software program, including possible implementation as a digital signal processor, micro-controller, or general-purpose computer, the present invention is not so limited. As would be apparent to one skilled in the art, various functions of software might also be implemented as processes of circuits. Such circuits might be employed in, for example, a single integrated circuit, a multi-chip module, a single card, or a multi-card circuit pack.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

It will be further understood that various changes in the details, materials, and arrangements of the parts which have been described and illustrated in order to explain the nature of this invention might be made by those skilled in the art without departing from the scope of the invention as expressed in the following claims.

I claim:

1. In a multi-port memory system, having a plurality of data memory banks and plurality of mapping memory banks, a method of accessing and storing data in the plurality of data memory banks comprising:
    A) reading, from one of the mapping memory banks selected by a read logical bank number, a read physical bank number identifying which one of the data memory banks data is to be read;
    B) reading, from each of the mapping memory banks other than the mapping memory bank selected by the read logical bank number, a physical bank number; and
    C) calculating a write physical bank number by hashing all of the physical bank numbers from step B) together with a constant, wherein the write physical bank number indicates which one of the data memory banks data is to be written;
    wherein the number of data memory banks equals the number of mapping memory banks, and each one of the data memory banks corresponds to one of the mapping memory banks.

2. The method of claim 1, wherein the mapping memory banks are addressed using a read offset address to read the read physical bank number, and a write offset address to read the at least one physical bank number.

3. The method of claim 1, wherein each of the mapping memory banks has a unique, sequentially numbered physical bank number associated therewith and the constant corresponds to all possible physical bank numbers hashed together.

4. The method of claim 3, wherein the hashing is by bitwise Exclusive-ORing.

5. The method of claim 1, wherein one of the mapping memory banks is designated as a spare mapping memory bank, and wherein if the read physical bank number equals to the write physical bank number, then the method further comprises the steps of:
   D) reading a spare physical bank number from the spare mapping memory bank addressed by the write offset address;
   E) write the spare physical bank number to a mapping memory bank selected by the write logical bank number and addressed by the write offset address; and
   F) writing the write physical bank number to the spare mapping memory bank addressed by the write offset address;
   wherein which one of the data memory banks data is to be written to is selected by the spare physical bank number, not the write physical bank number.

6. The method of claim 1, wherein the data memory banks are single-port memories.

7. The method of claim 6, wherein each of the mapping memory banks is a 1R1W memory, each 1R1W memory having the same depth as the corresponding single-port memory, and having a width of log 2(N+1) bits.

8. The method of claim 1, wherein the multi-port memory is a 1R1W two-port memory.

9. The method of claim 1, wherein, prior to using the two-port memory, each of the mapping memory banks are initialized by assigning the physical bank numbers stored in a mapping memory bank to be the same as the bank number of that mapping memory bank.

10. The method of claim 9, wherein the physical bank numbers stored within each of the mapping memory banks are stored in a scrambled order.

11. A multi-port memory system, comprising a plurality of data memory banks and an equal number of mapping memory banks, each data memory bank corresponding to a mapping memory bank, wherein the multi-port memory system is adapted to:
   A) read, from one of the mapping memory banks selected by a read logical bank number, a read physical bank number identifying which one of the data memory banks data is to be read;
   B) read, from each of the mapping memory banks other than the mapping memory bank selected by the read logical bank number, a physical bank number; and
   C) calculate a write physical bank number by hashing all of the physical bank numbers from step B) together with a constant, wherein the write physical bank number indicates which one of the data memory banks data is to be written.

12. The multi-port memory system of claim 11, wherein the data memory banks are single-port memories.

13. The multi-port memory system of claim 12, wherein each of the mapping memory banks are 1R1W two-port memories, each mapping memory having the same depth as the corresponding single-port memory, and having a width of log 2(N+1) bits.

14. The multi-port memory system of claim 12, wherein the multi-port memory is a 1R1W two-port memory.

15. The multi-port memory system of claim 12, wherein each of the single-port memories further comprises additional write ports, and wherein the multi-port memory system has a read port and write ports, the number of write ports being one more than the number of additional write ports.

* * * * *